(12) United States Patent
Vanden Bossche

(10) Patent No.: US 9,413,404 B2
(45) Date of Patent: Aug. 9, 2016

(54) METHOD AND SYSTEM FOR CHARACTERISING A FREQUENCY TRANSLATING DEVICE

(71) Applicant: National Instruments Ireland Resources Limited, Dublin (IE)

(72) Inventor: Marc Vanden Bossche, Bornem (BE)

(73) Assignee: National Instruments Ireland Resources Limited, Dublin (IE)

( * ) Notice: Subject to any disclaimer, the term of this patent is extended or adjusted under 35 U.S.C. 154(b) by 168 days.

(21) Appl. No.: 14/382,203

(22) PCT Filed: Feb. 28, 2013

(86) PCT No.: PCT/EP2013/054014
§ 371 (c)(1),
(2) Date: Aug. 29, 2014

(87) PCT Pub. No.: WO2013/127911
PCT Pub. Date: Sep. 6, 2013

(65) Prior Publication Data
US 2015/0056938 A1    Feb. 26, 2015

Related U.S. Application Data

(60) Provisional application No. 61/605,437, filed on Mar. 1, 2012.

(51) Int. Cl.
*H04B 17/00*    (2015.01)
*H04B 1/16*    (2006.01)
*G01R 27/32*    (2006.01)
*H03D 7/00*    (2006.01)
(Continued)

(52) U.S. Cl.
CPC   *H04B 1/16* (2013.01); *G01R 27/32* (2013.01);
*H03D 7/00* (2013.01); *H04B 17/391* (2015.01);
*G01R 23/00* (2013.01); *G01R 27/28* (2013.01);
*H03D 2200/0045* (2013.01)

(58) Field of Classification Search
CPC ........ G01R 27/26; G01R 27/28; G01R 27/32;
G01R 23/00; G01R 23/16
USPC ............... 455/67.11, 67.14; 324/76.23, 76.57
See application file for complete search history.

(56) References Cited

U.S. PATENT DOCUMENTS 6,064,694 A  *  5/2000  Clark ..................... G01R 27/32
324/601
6,405,147 B1 *  6/2002  Fera .................... G01R 31/2837
702/108

(Continued)

FOREIGN PATENT DOCUMENTS

EP    1 916 533 A1    4/2008
EP    2 081 031 A1    7/2009

*Primary Examiner* — Duc M Nguyen
(74) *Attorney, Agent, or Firm* — Meyertons Hood Kivlin Kowert & Goetzel, P.C.; Jeffrey C. Hood

(57) ABSTRACT

The present invention relates to a method for characterizing at a given frequency reflected waves of a frequency translating device having at least two ports, whereby information is available on the phase of a local oscillator driving the frequency translating device. The method comprises the steps of—applying at the at least two ports at least a tone at said given frequency and tones at said given frequency offset by the local oscillator signal frequency,—rotating the phase of the applied tone at said given frequency or exploiting a phase rotation of the local oscillator signal,—measuring at said given frequency amplitude and phase of reflected waves at the at least two ports and measuring at said given frequency and at said given frequency offset by the frequency of the local oscillator signal amplitude and phase of incident waves at the at least two ports,—determining parameters for a model of the frequency translating device by relating the amplitude and phase of the reflected waves to the incident waves, taking into account at least the local oscillator signal phase.

20 Claims, 4 Drawing Sheets

(51) Int. Cl.
  *H04B 17/391* (2015.01)
  *G01R 23/00* (2006.01)
  *G01R 27/28* (2006.01)

(56) References Cited

U.S. PATENT DOCUMENTS 7,720,137 B2 * 5/2010 He ................... G01R 31/2839
                                                        375/222
2004/0066182 A1 * 4/2004 Evers ................... G01R 27/28
                                                        324/76.23
2004/0257092 A1 * 12/2004 Verspecht ............. G01R 27/28
                                                        324/638
2007/0194776 A1 * 8/2007 Bossche ................ G01R 27/28
                                                        324/76.22
2009/0184721 A1 * 7/2009 Albert-Lebrun ....... G01R 27/32
                                                        324/601
2014/0368216 A1 * 12/2014 Pailloncy .............. G01R 25/00
                                                        324/602

* cited by examiner

METHOD AND SYSTEM FOR CHARACTERISING A FREQUENCY TRANSLATING DEVICE

FIELD OF THE INVENTION

The present invention is generally related to the field of radio frequency (RF) and microwave technology. More in particular, it relates to the field of characterising frequency translating devices.

BACKGROUND OF THE INVENTION

Different techniques to characterize frequency translating devices (FTD) can presently be implemented using commercially available vector network analyzers (VNA). Frequency translating devices are among others mixers where apart from the input and output port also the local oscillator (LO) port can be accessed to apply externally a local oscillator signal, mixers with integrated local oscillator and as such without access to the LO port, in phase/quadrature (IQ) modulators and demodulators or any other system or component arranged for producing a frequency translated signal. Such characterization is aimed to measure the reflection factors, leakage paths and frequency conversion factors of the FTD between all relevant ports, depending on accessibility.

Solutions have been proposed wherein a two-tone signal (i.e. two tones at a different frequency) is used to determine the frequency convertor terms (mainly group delay) for a FTD with integrated LO (hence, without access to the LO signal) in a differential way. By stepping the two-tones in frequency, with each time an overlapping frequency, it is possible to determine the frequency up and down converter terms separately, except for an unknown constant phase. This technique suffers from the fact that the mismatches of the FTD and of the measurement system are not determined and that the characterization does not include the dependency on at least the phase of the LO signal. Also the power dependency on the LO signal is missing, which is less important for this type of FTDs as the power is fixed for an integrated LO.

In patent document U.S. Pat. No. 6,690,722 a method is proposed to determine the frequency converter terms by measuring the reflection factor of the FTD with integrated LO with a one port network analyser, while applying known impedances at the other port of the FTD, which has been extended with a filter for image rejection to make the method work. This allows deriving the input reflection factor as such, which contains the combination of the up- and downconversion factor, but which is distorted by the reflection of the image rejection filter and the output reflection factor of the filter. The method needs to assume reciprocity between up conversion and down conversion to determine the frequency conversion factor.

Other possible techniques employ a mixer in addition to the FTD under test in the receiving path to convert to the same IF frequencies at all network analyzer ports. A mixer considered as ideal (also referred to as "golden" mixer in the technical literature) is used as reference and the FTD under test is measured and compared to that reference mixer. Such an approach is adopted e.g. in U.S. Pat. No. 6,448,786 and U.S. Pat. No. 7,248,033.

In U.S. Pat. No. 6,064,694 an alternative technique is presented based on the use of three mixers and results in the FTD characteristics assuming reciprocity between up and down conversion. Access to the LO is required for this method.

In the paper '*Multi-tone, Multi-port, and Dynamic Memory Enhancements to PHD Nonlinear Behavioral Models from Large-signal Measurements and Simulations*' (Verspecht et al., IEEE/MTT-S International Microwave Symposium, June 2007, pp. 969-972) it is explained that using X-parameters a model can be constructed for a mixer that takes into account the non-linear effect introduced by the LO drive signal and by the main tone applied to the input port of the mixer, which also acts as a large signal at large enough amplitudes. To extract this model, many more measurements need to be carried out in order to take into account the amplitude of both large signals and their phase differences.

While for linear devices the S-parameters provide a straightforward approach to characterize the device for arbitrary input signals or incident waves, none of the known techniques provides this functionality to characterize a mixer, or a frequency translating device (FTD) in general, for its most important or primary behaviour. Hence, there is a need for a primary model for a FTD, i.e. a model that describes at the same time all FTD reflections, transmissions and frequency conversion terms as a function of at least the phase of the LO drive signal and optionally also its power with arbitrary incident waves at all the accessible ports. The model assumes the LO is the only signal that drives the mixer into its non-linear domain of operation. This bounds the applicability of the model to the principal or primary behaviour of the frequency translating device. As said, to model this behaviour there is presently no straightforward method available.

SUMMARY OF THE INVENTION

It is an object of embodiments of the present invention to provide for method and system to determine a primary model that characterizes a frequency translating device, i.e. a model describing at the same time all FTD reflections, transmissions and frequency conversion terms as a function of at least the LO drive signal phase.

The above objective is accomplished by the solution according to the present invention.

In a first aspect the invention relates to a method for characterizing at a given frequency reflected waves of a frequency translating device having at least two ports, whereby information is available on the phase of a local oscillator signal driving the frequency translating device. The method comprises the steps of applying at the at least two ports at least a tone at the given frequency and tones at the given frequency offset by the local oscillator signal frequency, exploiting a phase rotation of the applied tone at the given frequency or a phase rotation of the local oscillator signal, measuring at the given frequency amplitude and phase of reflected waves at the at least two ports and measuring at the given frequency and at the given frequency offset by the frequency of the local oscillator signal amplitude and phase of incident waves at the at least two ports, determining parameters for a model of the frequency translating device by relating the amplitude and phase of the reflected waves to the incident waves, taking into account at least the local oscillator signal phase.

By applying the indicated method steps one indeed obtains a parametric model for the frequency translating device. The model takes at least into account the effect of the local oscillator signal phase. By exploiting a phase rotation a plurality of measurement experiments are performed that yield sufficient information to compute the parameter values from. An important specific feature of the proposed solution is that the model considers all reflected waves at a given frequency and relates these reflected waves at that given frequency to the incident waves at the frequencies which will impact that given frequency, namely the given frequency and the given frequency offset by the LO frequency or multiples thereof.

In a preferred embodiment the method comprises a step of determining parameters for a model of said frequency translating device by relating said amplitude and phase of said reflected waves to said incident waves, also taking into account the local oscillator signal power.

Advantageously, the local oscillator signal power is stepped, so that power dependent parameters are obtained.

In another embodiment the tone at said given frequency and the tones at said given frequency offset by the local oscillator signal frequency are applied simultaneously. This shortens the time to collect the measurement data. In a more specific embodiment the tone at said given frequency and the tones at said given frequency offset by the local oscillator signal frequency are applied simultaneously at at least a first and a second port of the at least two ports of the frequency translating device.

In an advantageous embodiment a characterisation is performed at a plurality of given frequencies, whereby at the at least two ports at least tones are applied at said plurality of given frequencies and tones at said plurality of given frequencies offset by the local oscillator signal frequency.

Preferably the tone at said given frequency and the tones at said given frequency offset by the local oscillator signal frequency are part of a multi-tone signal.

In one embodiment a tone is applied not only at said given frequency and at said given frequency offset by the local oscillator signal frequency, but also at said given frequency offset by a multiple of the local oscillator signal frequency.

In one embodiment the frequency translating device has more than three ports. In certain embodiments one of said ports is a port for the local oscillator signal. In other embodiments the local oscillator is embedded in the frequency translating device.

In another aspect the invention relates to a measurement system for characterizing at a given frequency a frequency translating device having at least two ports, whereby information is available on the phase of a local oscillator signal driving said frequency translating device. The measurement system is adapted for performing the method as previously described and comprises a processing means for determining parameters for a model of the frequency translating device by relating the amplitude and phase of the reflected waves to the incident waves, taking into account at least the local oscillator signal phase.

In a preferred embodiment the measurement system is arranged for applying at said at least two ports a multi-tone signal comprising a tone at said given frequency and tones at said given frequency offset by the local oscillator signal frequency, and for rotating the phase of said applied tones or for exploiting a phase rotation of said local oscillator signal. The measurement system further comprises measurement means for measuring at said given frequency amplitude and phase of reflected waves at said at least two ports and measuring at the given frequency and at the given frequency offset by the frequency of the local oscillator signal amplitude and phase of incident waves at the at least two ports.

In a preferred embodiment the measurement system is arranged for providing a 50 Ohm termination at a non-excited port of said at least two ports.

In a further embodiment the measurement system comprises a control loop adapted to monitor the local oscillator signal power.

In a further embodiment the measurement system is arranged for applying a tone not only at said given frequency and at said given frequency offset by the local oscillator signal frequency, but also at said given frequency offset by a multiple of the local oscillator signal frequency.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, wherein like reference numerals refer to like elements in the various figures.

DETAILED DESCRIPTION OF ILLUSTRATIVE EMBODIMENTS

Figure 1:
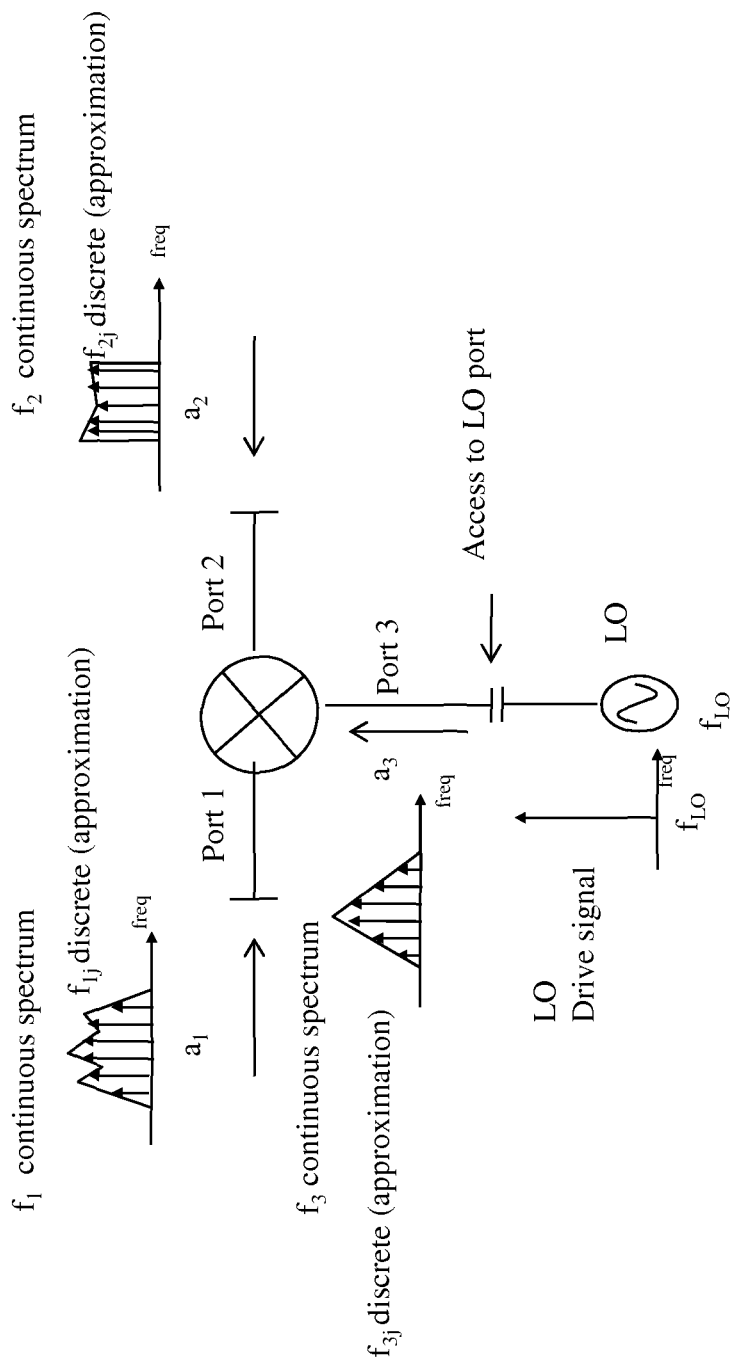
FIG. 1 illustrates a 3-port frequency translation device with incident waves consisting of an arbitrary spectrum.

The present invention will be described with respect to particular embodiments and with reference to certain drawings but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

The present invention discloses a method and a measurement system that provides a primary model and its parameters of a FTD. It is assumed that one has at least access to the phase of the LO signal, be it directly at the LO port or indirectly via a signal leaking into at least one of the accessible ports, said signal having a phase representative of the LO signal phase. The waves travelling away from the FTD are called in general the reflected waves (b-waves) and the waves travelling towards the FTD are called in general the incident waves (a-waves). Sometimes, based on the FTD functionality, the wave $b_2$ and $b_3$ are called transmitted waves, where the subscripts indicate the port number and port 3 is considered the port with the LO drive signal. As said the model predicts the reflected waves, at least at two ports (typically the RF and IF or LF port) but possibly also at the LO drive port, as a function of arbitrary incident waves at at least the two above mentioned ports, but possibly also at the LO drive port. The incident waves are referred to as 'arbitrary' because the frequency content can be arbitrary. Of course, the model can only take into account the frequency content of the incident and reflected waves within the measurement system bandwidth. The primary model assumes that only the LO drive signal causes the device to operate in non-linear mode and that the arbitrary waves at all ports (excluding the LO drive signal) do not change the FTD's non-linear behaviour. The model accounts for the impact of the LO drive signal phase and possibly the dependency on the LO drive power. As such the primary model parameters are dependent on the phase and possibly on the power level of the LO drive signal.

Existing models describe the reflected waves as a function of the tones present in the incident waves by calculating the mixing products. This results in reflected waves at different frequencies being a combination of the frequencies present in the incident waves. The approach according to this invention describes all reflected waves ($b_1$, $b_2$ and possibly $b_3$) at a given frequency and calculates back the tones in the incident waves ($a_i$), which will contribute to that considered frequency. Besides that this primary model allows easy generalization, it is also much more suited to be used in simulators, e.g. a harmonic balance simulator, where one typically calculates a response at a given frequency.

The model can be extracted for an FTD with integrated LO port if at one of the accessible ports a signal is available containing at least one tone having a phase which is representative of the LO drive signal phase. This signal is typically present due to the leakage of the LO signal to the RF and/or the IF port of the FTD.

A typical FTD has three ports or, when the LO is integrated, two ports. However, a person skilled in the art would readily know how to extend the teaching to an N-port where at one port the LO drive signal is provided or where the LO drive is integrated.

A frequency translating device is considered with three ports (FIG. 1) and its operation, which will be modelled by the primary model, is described. One port (port 3) is the LO drive port and will be driven by at least one tone, generated by the local oscillator LO and called the LO drive signal at $f_{lo}$. For each port i an incident wave $a_i$ is considered as excitation signal, with a given spectral content. When the spectral content is continuous in frequency it is approximated by a discrete spectrum $f_{ij}$, dense enough to allow interpolation once the model has been determined. The reflected waves $b_k$ comprise the sum of all spectra $f_{ij}$, complemented with the mixing products ($f_{ij}+/-nf_{lo}$).

Figure 2:
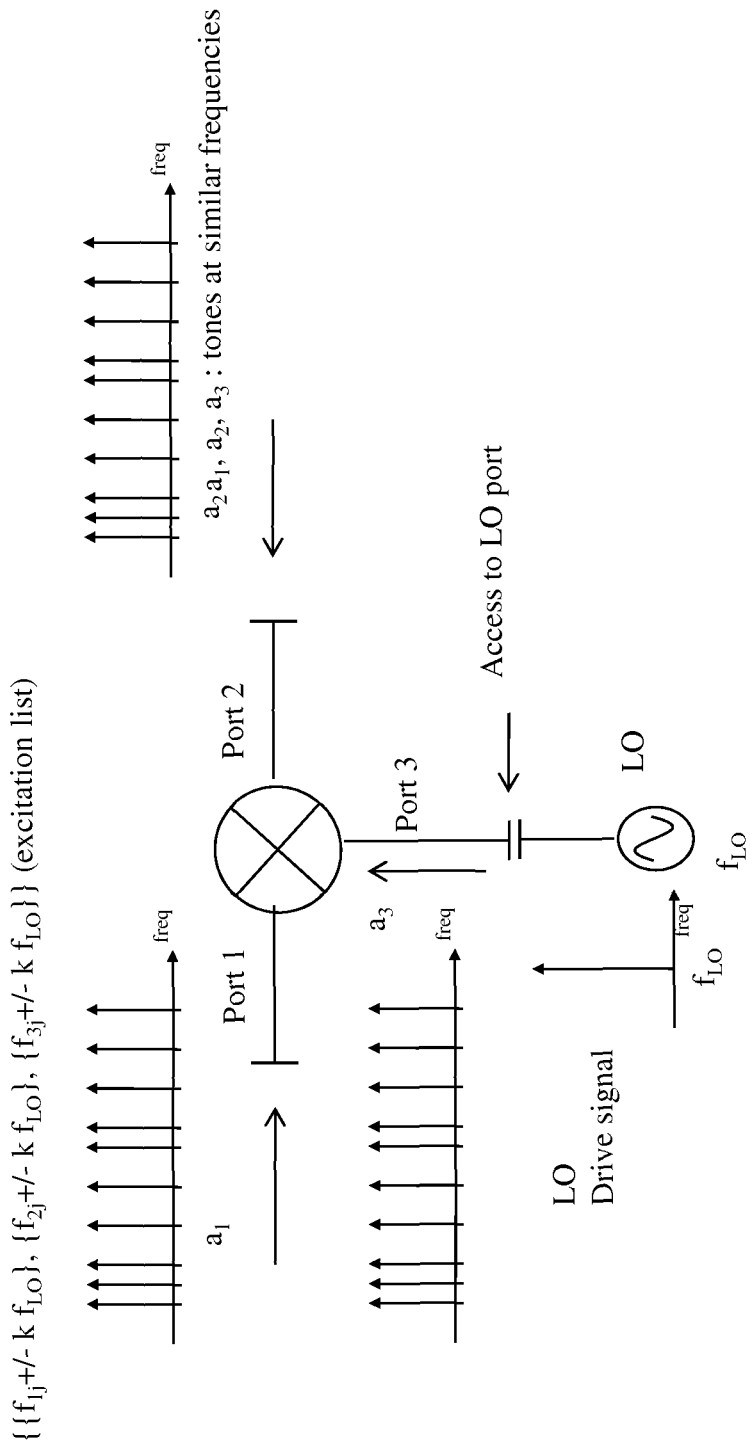
FIG. 2 illustrates the same 3-port FTD under more realistic conditions, taking into account mismatches.

In most practical cases, $a_1$ is enforced by some external means, e.g. the circuit in front of the mixer. The motivation to use a FTD is to down- or upconvert the incident wave at port 1, resulting in the down- or upconverted transmitted wave at port 2. Typically this results in transmitted ($b_2$ and $b_3$) and reflected ($b_1$) waves containing the original spectra and the spectra mixed with $nf_{lo}$. The integer number n represents the order of non-linearity that is causing the mixing product. The transmitted and reflected waves are reflected because of the mismatch of the measurement system or because of mismatches of the surrounding circuitry. As such quantities $a_2$ and $a_3$ resulting from these mismatches contain tones at the original spectra and the mixing products. Also a part of $a_1$ is the result of mismatches at port 1 and contains tones at the original spectra and the mixing products. Therefore one considers that the incident wave $a_k$ comprises the sum of all spectra $f_{ij}$, complemented with the mixing products ($f_{ij}+/-nf_{lo}$) (FIG. 2). This set of frequencies is further referred to as the excitation list, because these tones will be present in the incident wave $a_j$, given a set of excitation tones $f_{kj}$ at port k.

To build a primary model describing the reflected wave at port i ($b_i$) at a given frequency $f_0$ one needs to consider the tones with the mixing products ($f_0+/-nf_{lo}$) incident to at least to port 1 (e.g. RF) and port 2 (e.g. LF) ($a_1$ and $a_2$), possibly also to the LO port ($a_3$). When ($f_0+/-nf_{lo}$) is negative, one uses the complex conjugate tone at $|f_0+/-nf_{lo}|$.

The quantities determining the non-linear mode of operation of the FTD are referred to as the 'large signal operating point' (LSOP). For a FTD, this is typical the LO power in combination with the LO signal frequency.

The primary model and its parameters, which describe the reflected waves as a function of the incident waves whereby the incident waves can be an arbitrary signal with any frequency content, is given by:

$$b_k(f_0) = \sum_l S_{k,l}(LSOP)a_l(f_0) + \sum_l S_{k,l,+1}(LSOP)a_3(-f_{LO})a_l(f_0 + f_{LO}) + \quad (1)$$
$$\sum_l S_{k,l,-1}(LSOP)a_3(f_{LO})a_l(f_0 - f_{LO}) + \cdots +$$
$$\sum_l S_{k,l,n}(LSOP)a_3^{|n|}(-sign(n)f_{LO})a_l(f_0 + sign(n)f_{LO})$$

with LSOP determined by $|a_3(f_{LO})|$ and $f_{LO}$ where port 3 is the LO port. When the LO drive signal becomes zero, there is no signal conversion anymore and the equations reduce to the S-parameters. When n=1 and three ports are considered, this results into 27 parameters: $S_{k,l}$, $S_{k,l,1}$ and $S_{k,l,-1}$. Other variants of this equation are possible. One variant is to replace $a_3(+/-f_{lo})$ by only the phase of $a_3(+/-f_{lo})$.

To determine S-parameters for a 3-port device at a given frequency $f_0$, which allows predicting the reflected waves ($b_i$) at $f_0$, a tone $f_0$ is typically applied sequentially at the different ports while measuring and collecting each time incident and reflected waves at $f_0$. The S-parameters are calculated at $f_0$ with processing means adapted for applying linear algebra techniques.

In the simple 3-port case (n=1—see above), instead of 9 S-parameters 27 parameters relate the reflected waves at a given frequency $f_0$ to the incident waves. The frequency $f_0$ is part of the excitation list. Similar to S-parameter extraction at $f_0$, one needs to apply input stimuli at the different ports. More precisely, one needs to apply now sequentially different input stimuli at $f_0$, $|f_0+/-nf_{lo}|$ (with n=1 for this simple case) at the different ports, while maintaining the power and frequency of the LO drive constant, meanwhile measuring each time the incident waves at all ports at frequencies $f_0$ and $|f_0+/-nf_{lo}|$ and reflected waves at all ports at the frequency $f_0$ (as dictated by the above equations). Enough independent experiments need to be performed to be able to determine the 27 parameters with linear algebra calculations. As the number of resulting experiments is not enough to calculate the 27 parameters if one just applies sequentially a tone at $f_0$ and $|f_0+/-nf_{lo}|$, one also steps each time, while applying the tone, the phase of either the LO drive signal or the phase of the tone applied, typically equally distributed across 360 degrees, such that a number of experiments is performed equal to or higher than the required number of parameters. With an embedded LO one takes advantage of the fact that the LO drive signal slips compared to the applied one tone. This procedure can then be repeated for different frequencies $f_0$, belonging to the excitation list.

The above described procedure can be repeated for different values of the LSOP, resulting in parameters of the primary model which are depending on the LSOP.

Applying different input stimuli at $f_0$ and $|f_0+/-nf_{lo}|$ can be achieved by applying a one-tone signal sequentially at the different frequencies $f_0$ and $|f_0+/-nf_{lo}|$ and at the different ports, as described above.

Applying different input stimuli at $f_0$ and $|f_0+/-nf_{lo}|$ can also be done by applying different sets of multi-tones with for each set a different phase relationship, either by changing the LO phase or the phase relationships of the multi-tones and such that combining all sets covers the complete required excitation list, and repeat this for each port. In this way the primary model can be extracted much faster than with one tone that needs to scan the list for each port. If it is possible to apply simultaneously all multi-tones at all ports for which a primary model is wanted, the model can be extracted even faster.

For the engineer, knowledgeable in the field, it is possible to generalize the approach for more than two ports besides the LO port that can be either accessible or integrated.

In comparison to a mixer model based on X-parameters, the presented primary model assumes that only the LO drive signal brings the FTD in a non-linear mode of operation. As such superposition is valid, taking into account the proper frequency shifts due to the presence of the LO drive signal. As such the extraction method by itself and the extraction method on a given apparatus become simple and straightforward. Of course the model validity is bound by the applied assumption, but it covers the first order and as such the most important or primary behaviour of FTDs. In fact, the strength and capability of the primary model is exactly the same as S-parameters for linear devices, but now extended for frequency translating devices. Note that the difference between this invention and the X-parameter approach is similar to the difference between S-parameters and X-parameters or S-functions for an amplifier.

The measurement system contains at least a measurement means to measure directly (if one has access to the LO port) or indirectly (via the presence of a tone with representative phase in one of the signals at the other ports, e.g. leakage signal) the phase of the LO drive signal at a given LO frequency $f_{lo}$.

The measurement system is arranged for applying at least sequentially a one-tone signal at different required frequencies belonging to the excitation list, to the ports which are part of the model to predict the reflected wave at the given frequency occurring in the excitation list. When the primary model is a multi-port model (including at least $a_1$ and $a_2$, which is usually the case), the measurement system is capable of applying the one-tone at least sequentially to each port of interest.

The measurement system is adapted to change either the phase of this one-tone or the phase of the LO drive signal while applying that one-tone at a given frequency $f_0$. In case of an embedded LO, one exploits the fact the phase of the LO drive signal is rotating compared to the applied tone. The change in phase can also be realized by offsetting the frequency slightly from the required frequency, either for the applied one-tone $f_0$ or for the LO drive signal when access to the LO port is possible. To minimize measurement time in the latter case, the measurement system can be adapted to measure the incident and reflected waves over at least a period related to the frequency offset.

The measurement system is capable of measuring the amplitude and phase of the incident and reflected wave at the given frequency $f_0$ and combinations with the LO drive frequency ($f_0+/-nf_{lo}$) at the ports relevant to the primary model.

The measurement system comprises a processing unit that can calculate the primary model parameters from the measurements of the incident and reflected waves using well-known linear algebra techniques.

Figure 3:
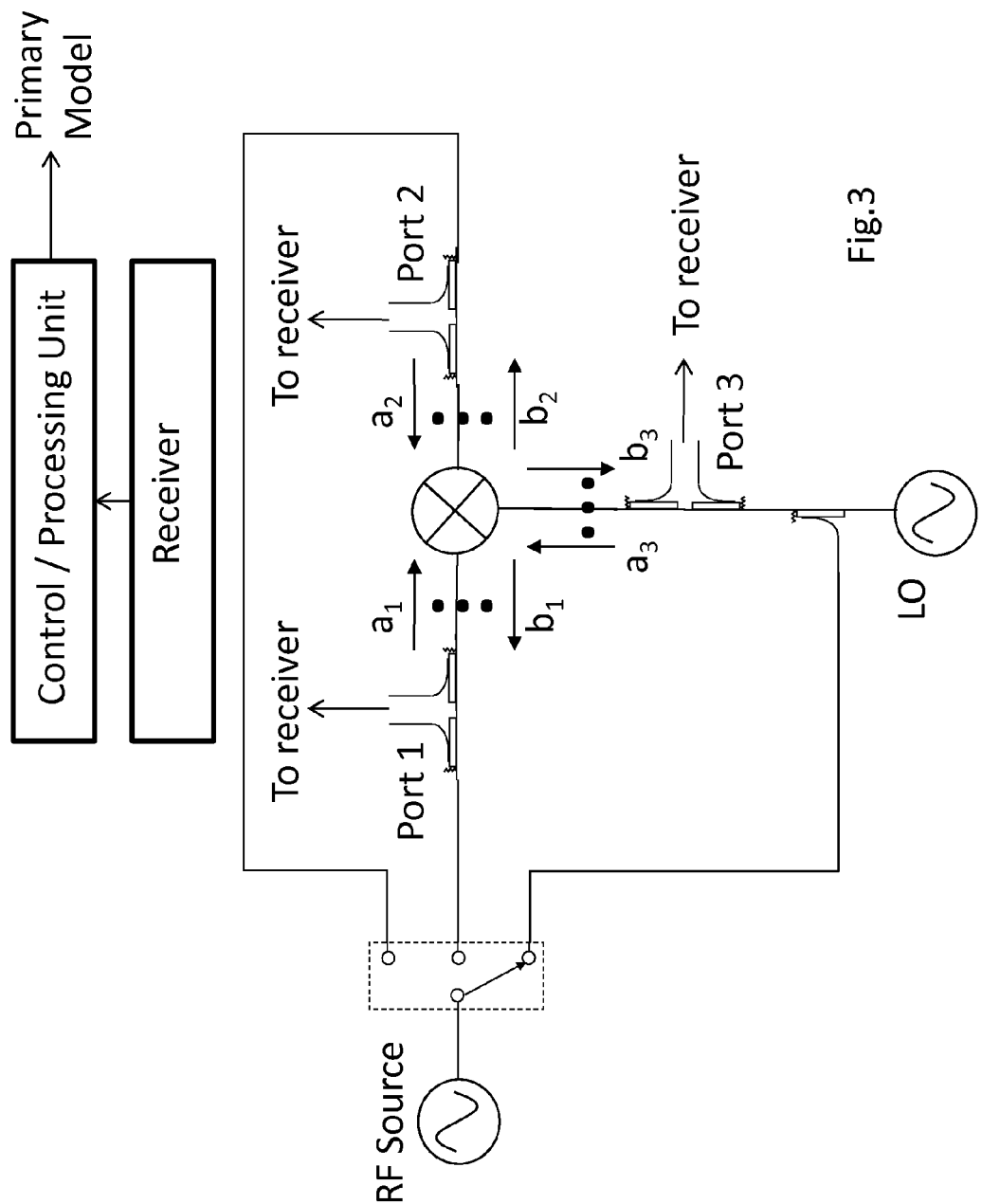
FIG. 3 illustrates the measurement system to characterize and extract the primary model based on a one tone excitation.

An embodiment of the invention is depicted in FIG. 3, showing a measurement system where using a RF source a one-tone signal can be applied at different frequencies at a given port. The RF source can be connected to the different ports of interest. To improve the conditioning of the equations to solve (see above equations), it is possible to provide proper terminations (typically 50 Ohm) for the ports to which the RF source is not connected.

The LO source generates a local oscillator signal at a frequency $f_{LO}$ with given input power. The RF source is connected to port 1 and a tone is applied at a frequency of the excitation list. Typically one steps sequentially through the list. The phase of the LO source or the RF source, depending on the hardware capabilities, is stepped. Typically, one opts for equally distributed phase values. For each phase value, the incident and reflected waves at all ports of interest are measured, at least at the frequencies $f_0$ and $|f_0+/-nf_{lo}|$. Typically a complete dense grid is directly measured from which the tones of interest are selected. The RF source will be set to the next frequency and a measurement is performed. This is repeated until all frequencies from the excitation list are covered. The RF source is then switched to the next port while the other ports possibly get terminated. Finally the primary model parameters are calculated with linear algebra means, typically a singular value decomposition (SVD) to qualify the independence of the different measurements. This procedure can be repeated for a different level of LO power.

Figure 4:
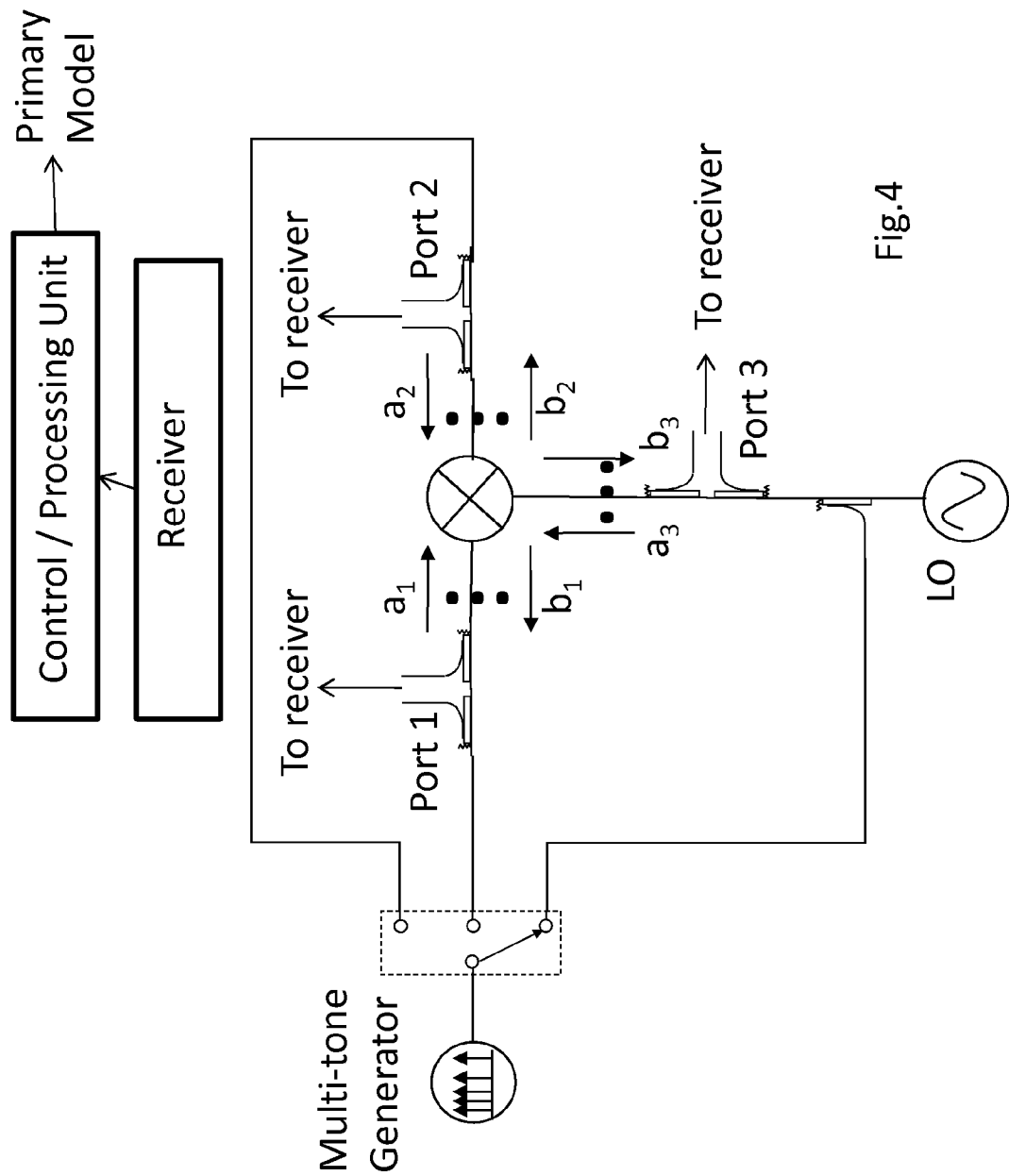
FIG. 4 illustrates the measurement system to characterize and extract the primary model based on a multi-tone excitation.

In another embodiment of the measurement system according to the invention, shown in FIG. 4, a multi-tone is applied (using for example an arbitrary waveform generator) covering all or a subset of frequencies of the excitation list at a given port and where the multi-tone can be connected to the different ports of interest of the FTD.

To improve the conditioning of the equations to solve (see above), proper terminations (typically 50 Ohm) can be provided for the ports to which the multi-tone is not connected.

The LO source will be put at a LO frequency and given input power. The multi-tone is connected to port 1. Different sets of multi-tones are applied, all with a different phase relationship compared to the LO signal or stepping the phase of the LO source. For each set, the incident and reflected waves at all ports of interest are measured, at all frequencies required by the equations (see above). The multi-tone is then switched to the next ports while the other ports possibly get terminated. Finally, the parameters of the primary model are calculated with linear algebra means, typically a SVD to qualify the independence of the different measurements. This procedure can be repeated for a different level of LO power.

In the above the LO power is assumed constant, while the tones are applied to the different ports. Depending on the interactions of the applied tone and the LO drive signal, it is possible that the LO power fluctuates. This is solved by adding a control loop in the measurement system where the power of the LO signal is monitored, either by analogue means or computing means and adapted so that it can be considered constant. It is also possible to adapt the above equation (1) to include small variations of the LO power by linearization around an average power. In this way the variation is taking into account at the cost of more measurements.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A method for characterizing at a given frequency reflected waves of a frequency translating device having at least two ports, whereby information is available on the phase of a local oscillator signal driving said frequency translating device, the method comprising:
   applying at said at least two ports at least a tone at said given frequency and tones at said given frequency offset by the local oscillator signal frequency;
   rotating the phase of said applied tone at said given frequency or exploiting a phase rotation of said local oscillator signal;
   measuring at said given frequency amplitude and phase of reflected waves at said at least two ports and measuring at said given frequency and at said given frequency offset by the frequency of said local oscillator signal amplitude and phase of incident waves at said at least two ports; and
   determining parameters for a model of said frequency translating device by relating said amplitude and phase of said reflected waves to said incident waves, taking into account at least the local oscillator signal phase.

2. The method for characterizing as in claim 1, wherein the parameters for the model of said frequency translating device are determined also taking into account the influence of local oscillator signal power.

3. The method for characterizing as in claim 2, wherein said local oscillator signal power is stepped, so that power dependent parameters are obtained.

4. The method for characterizing as in claim 1, wherein said tone at said given frequency and said tones at said given frequency offset by the local oscillator signal frequency are applied simultaneously.

5. The method for characterizing as in claim 4, wherein said tone at said given frequency and said tones at said given frequency offset by the local oscillator signal frequency are applied simultaneously at a first and a second port of said at least two ports.

6. The method for characterizing as in claim 1, wherein a characterisation is performed at a plurality of given frequencies, whereby at said at least two ports at least tones are applied at said plurality of given frequencies and tones at said plurality of given frequencies offset by the local oscillator signal frequency.

7. The method for characterizing as claim 1, wherein said tone at said given frequency and said tones at said given frequency offset by the local oscillator signal frequency are part of a multi-tone signal.

8. The method for characterizing as in claim 1, wherein a tone is applied at said given frequency and at said given frequency offset by a multiple of said local oscillator signal frequency.

9. The method for characterizing as in claim 1, wherein said frequency translating device has more than three ports.

10. The method for characterizing as in claim 9, wherein one of said ports is a port for the local oscillator signal.

11. A measurement system for characterizing at a given frequency a frequency translating device having at least two ports, whereby information is available on the phase of a local oscillator signal driving said frequency translating device, said measurement system and comprising:

measurement means; and processing means;

wherein the measurement system is configured to:

apply at said at least two ports at least a tone at said given frequency and tones at said given frequency offset by the local oscillator signal frequency; and rotate the phase of said applied tone at said given frequency or exploiting a phase rotation of said local oscillator signal;

wherein the measurement means are configured to:

measure at said given frequency amplitude and phase of reflected waves at said at least two ports; and measure, at said given frequency and at said given frequency offset by the frequency of said local oscillator, signal amplitude and phase of incident waves at said at least two ports; and wherein the processing means are configured to:

determine parameters for a model of said frequency translating device by relating said amplitude and phase of said reflected waves to said incident waves, taking into account at least the local oscillator signal phase.

12. The measurement system as in claim 11, wherein the measurement system is further configured to:

apply at said at least two ports a multi-tone signal comprising a tone at said given frequency and tones at said given frequency offset by the local oscillator signal frequency; and rotate the phase of said applied tones or for exploiting a phase rotation of said local oscillator signal;

wherein said measurement means are further configured to:

measure, at said given frequency, amplitude and phase of reflected waves at said at least two ports and measuring at said given frequency and at said given frequency offset by the frequency of said local oscillator signal amplitude and phase of incident waves at said at least two ports.

13. The measurement system as in claim 11, further configured to:

provide a 50 Ohm termination at a non-excited port of said at least two ports.

14. The measurement system as in claim 11, wherein said measurement system comprises a control loop adapted to monitor the local oscillator signal power.

15. The measurement system as in claim 11, wherein the parameters for the model of said frequency translating device are determined also taking into account the influence of local oscillator signal power.

16. The measurement system as in claim 15, wherein said local oscillator signal power is stepped, so that power dependent parameters are obtained.

17. The measurement system as in a claim 11, wherein said tone at said given frequency and said tones at said given frequency offset by the local oscillator signal frequency are applied simultaneously.

18. The measurement system as in claim 17, wherein said tone at said given frequency and said tones at said given frequency offset by the local oscillator signal frequency are applied simultaneously at a first and a second port of said at least two ports.

19. The measurement system as in claim 11, wherein the measurement system is configured to perform said characterising at a plurality of given frequencies, whereby at said at least two ports at least tones are applied at said plurality of given frequencies and tones at said plurality of given frequencies offset by the local oscillator signal frequency.

20. The measurement system as in claim 11, wherein said tone at said given frequency and said tones at said given frequency offset by the local oscillator signal frequency are part of a multi-tone signal.

\* \* \* \* \*